US007155301B2

(12) United States Patent
Li et al.

(10) Patent No.: US 7,155,301 B2
(45) Date of Patent: Dec. 26, 2006

(54) METHOD AND SYSTEM FOR DYNAMIC MODELING AND RECIPE OPTIMIZATION OF SEMICONDUCTOR ETCH PROCESSES

(75) Inventors: Kun Li, Milpitas, CA (US); Mark A. Erickson, Sacramento, CA (US); Ioannis Kanellakopoulos, Cupertino, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/523,777

(22) PCT Filed: Aug. 28, 2003

(86) PCT No.: PCT/US03/27341

§ 371 (c)(1),
(2), (4) Date: Jul. 8, 2005

(87) PCT Pub. No.: WO2004/021405

PCT Pub. Date: Mar. 11, 2004

(65) Prior Publication Data
US 2005/0289487 A1 Dec. 29, 2005

Related U.S. Application Data

(60) Provisional application No. 60/406,905, filed on Aug. 28, 2002.

(51) Int. Cl.
*G06F 19/00* (2006.01)

(52) U.S. Cl. ............................. 700/121; 700/97; 716/4; 716/5; 316/59
(58) Field of Classification Search ................ 700/97, 700/121; 716/4, 5; 216/59
See application file for complete search history.

(56) References Cited

U.S. PATENT DOCUMENTS 6,133,132 A 10/2000 Toprac et al.
2005/0098535 A1* 5/2005 Lansford et al. .............. 216/59

OTHER PUBLICATIONS

Baker et al. "In-situ prediction of RIE time to completion using neural networks" IEEE Electronincs Manufacturing Technology Symposium 1994, pp. 319-324, Sep. 1994.*

* cited by examiner

*Primary Examiner*—Leo Picard
*Assistant Examiner*—Steven R. Garland
(74) *Attorney, Agent, or Firm*—Wood, Herron & Evans, L.L.P.

(57) ABSTRACT

A method and system are disclosed for creating dynamic models of etch processes in semiconductor manufacturing. In one embodiment, a method comprises modeling an etch process used in semiconductor manufacturing to generate a dynamic process model. The dynamic process model is used to determine input values that result in a desired output value. A process recipe is optimized for the etch process with the input values.

39 Claims, 8 Drawing Sheets

Top View of Cell

Desired Result:
< 100 Å deviation
230

METHOD AND SYSTEM FOR DYNAMIC MODELING AND RECIPE OPTIMIZATION OF SEMICONDUCTOR ETCH PROCESSES

This application claims the benefit of the filing date of the following Provisional U.S. Patent Applications:

Method and System for Modeling Dynamic Etch Processes, U.S. Provisional Application Ser. No. 60/406,905, filed on Aug. 28, 2002.

FIELD OF THE INVENTION

The present invention relates generally to semiconductor manufacturing and, in particular to, a method and system for process modeling and recipe optimization of semiconductor etch processes.

BACKGROUND OF THE INVENTION

In semiconductor manufacturing, an important problem is optimizing the recipes for Chemical Vapor Deposition (CVD) processes, such as BoroPhosphoSilicate Glass (BPSG) processes, in order to meet specific performance criteria. For example, in cell formation processing, manufacturers typically use a 3-step process consisting of (1) BPSG CVD, (2) plasma etch, and (3) wet clean/etch. FIG. 1 illustrates an exemplary prior art 3-step BPSG CVD process for cell formation processing, according to one embodiment of the present invention.

The purpose of this 3-step process is to etch out cylindrical cells on the substrate, which are then typically filled with conductive materials and used to manufacture computer components, such as memory. These cells need to have a minimum diameter along their depth and to be separated by a minimum distance, also along their depth, in order to maintain their desired conductive properties. At the same time, manufacturers want to etch these cells as close as possible to one another, in order to maximize their yield: the closer these cells are to each other, the more cells fit on a single wafer, and thus the more components can be manufactured out of a single wafer.

FIG. 2 illustrates an exemplary prior art diagram of the top view of a single cell 600 with an elliptical shape along the X-axis and Y-axis. Each semiconductor wafer contains many of these cells next to each other. The sidewall profiles of these cells are typically measured by cutting the wafer either along the X-axis 610 or along the Y-axis 620 and then using an imaging method such as Scanning Electron Microscopy to generate an image of the cross-section of the cells.

FIG. 3 illustrates a prior art diagram of ideal and typical sidewall profiles in cell formation processing. The ideal cell sidewall profile 210 for placing as many cells as possible on a single wafer is a perfect cylinder. Typical recipe design is based on trial-and-error optimization, and generates sidewall profiles 220 that typically have more than 1000 Å (Angstroms) total deviation from the completely vertical cylindrical profile as illustrated in FIG. 3.

The problem at hand, then, is a systematic method for optimizing the recipes for cell formation processing, so that the actual results are much closer to the ideal cylindrical profile than they are today.

SUMMARY OF THE INVENTION

A method and system are disclosed for creating dynamic models of etch processes in semiconductor manufacturing. The models incorporate linear and nonlinear dynamics, and are used to optimize process recipes in order to improve the resulting sidewall profiles.

BRIEF DESCRIPTION OF THE DRAWINGS

Features and advantages of the prevention invention will be apparent to one skilled in the art in light of the following detailed description in which.

DETAILED DESCRIPTION

Figure 1:
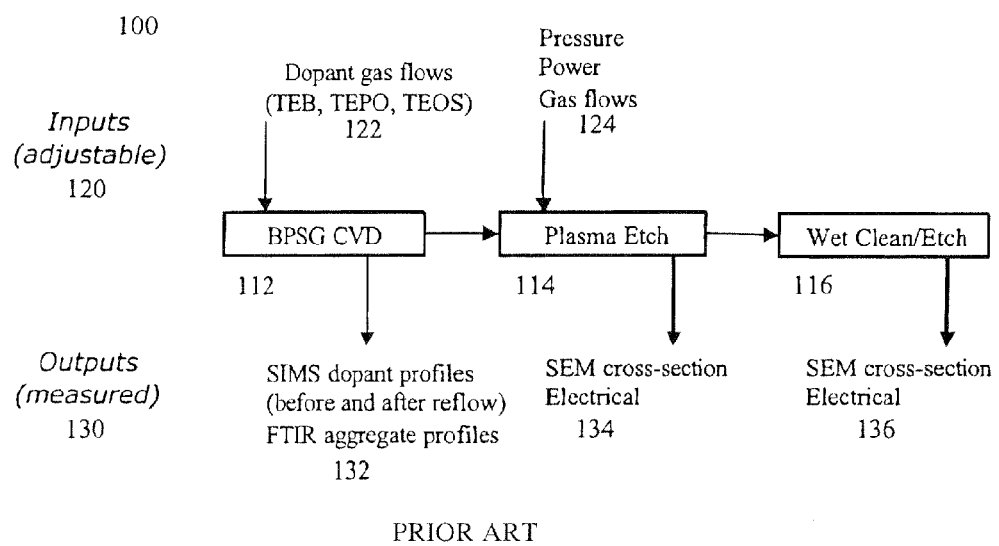
FIG. 1 illustrates an exemplary prior art 3-step BPSG CVD process for cell formation processing.
Figure 2:
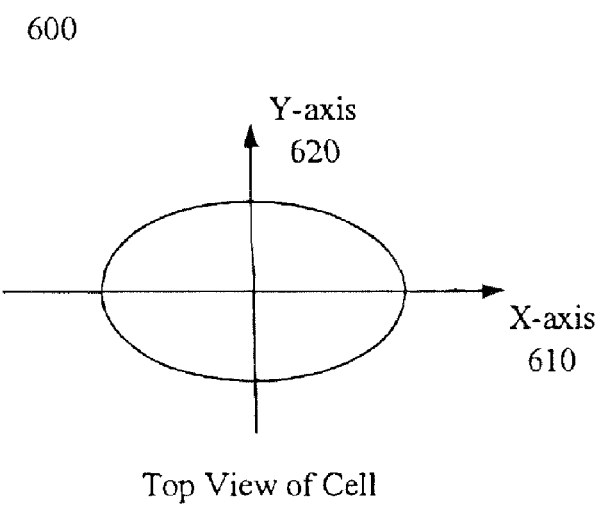
FIG. 2 illustrates an exemplary prior art diagram of the top view of a single cell with an elliptical shape along the X-axis and Y-axis.
Figure 3:
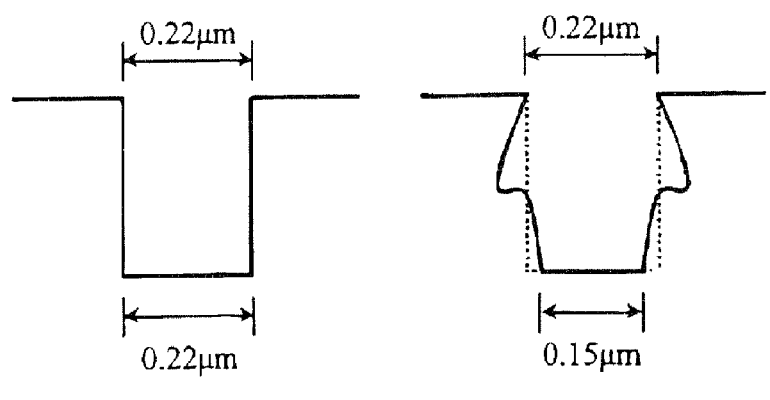
FIG. 3 illustrates a prior art diagram of ideal and typical sidewall profiles in cell formation processing.

A method and system are described for creating dynamic models for etch processes and using those models for recipe optimization. For purposes of discussing and illustrating the invention, examples will be given in the context of Chemical Vapor Deposition (CVD) processes, and more specifically in the context of BoroPhosphoSilicate Glass (BPSG) processes. However, one skilled in the art will recognize and appreciate that the same modeling issues arise in other types of etch processes, and that the techniques disclosed are applicable in these areas as well.

In the following description, for purposes of explanation, numerous specific details are set forth in order to provide a thorough understanding of the present invention. It will be evident, however, to one skilled in the art that the present invention may be practiced without these specific details. In some instances, well-known structures and devices are shown in block diagram form, rather than in detail, in order to avoid obscuring the present invention. These embodiments are described in sufficient detail to enable those skilled in the art to practice the invention, and it is to be understood that other embodiments may be utilized and that logical, mechanical, electrical, and other changes may be made without departing from the scope of the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention can be implemented by an apparatus for performing the operations herein. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor or by any combination of hardware and software. One of skill in the art will immediately appreciate that the invention can be practiced with computer system configurations other than those described below, including hand-held devices, multiprocessor systems, microprocessor-based or programmable consumer electronics, DSP devices, network PCs, minicomputers, mainframe computers, and the like. The invention can also be practiced in distributed computing environments where tasks are performed by remote processing devices that are linked through a communications network. The required structure for a variety of these systems will appear from the description below.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein.

Furthermore, it is common in the art to speak of software, in one form or another (e.g., program, procedure, application . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one skilled in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

Spatial Dynamic Modeling of Etch Processes

Figure 4:
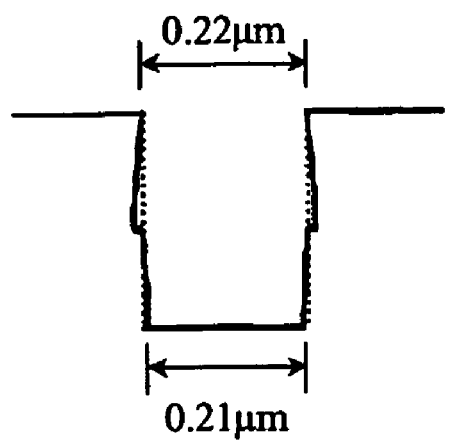
FIG. 4 illustrates an exemplary diagram of an optimized sidewall profile, according to one embodiment of the present invention.

The main difficulty in optimizing recipes for semiconductor etch processes is the fact that one has to deal with many variables, which are all interconnected through highly complex relationships. Referring back to FIG. 1, the 3-step CVD process 100 includes many inputs 120 to the system (dopant gas flows 122, such as TEB (TriEthyl Borate) gas flow, TEPO (TriEthyl PhOsphate) gas flow, and TEOS (TetraEthyl OrthoSilicate) flow, plasma etch inputs 124, such as pressure, power, gas flows, etc.), and many outputs 130 (CVD outputs 132 such as SIMS (Secondary Ion Mass Spectrometry) dopant profiles before and after reflow and FTIR (Fourier Transform Infrared Spectroscopy) aggregate dopant profiles, plasma etch outputs 134 and wet clean outputs 136 such as electrical measurements, CD (Critical Dimension) measurements, SEM (Scanning Electron Microscopy) cross-section sidewall profiles before wet clean/etch 134 and after wet clean/etch 136 in both the X-axis 610 and Y-axis 620 directions, etc.). Considering that there are a large number of variables, that there are multiple steps in this process, (each of which is affected by several parameter settings), and that each of these steps represents a complex chemical process that is difficult to model accurately, optimizing cell sidewall profiles is a difficult task. Adequate models for this process have not yet been developed in the industry, making it difficult to accurately predict the sidewall profile that will result from a specific combination of input values. Therefore, it is very difficult to select a recipe, namely a combination of values for these inputs, which will yield nearly vertical sidewall profiles. FIG. 4 illustrates an exemplary diagram of an optimized sidewall profile 230, according to one embodiment of the present invention. The optimized sidewall profile 230 allows for a significant increase in cell density on a processed wafer by minimizing sidewall deviation to less than 100.

Figure 5:
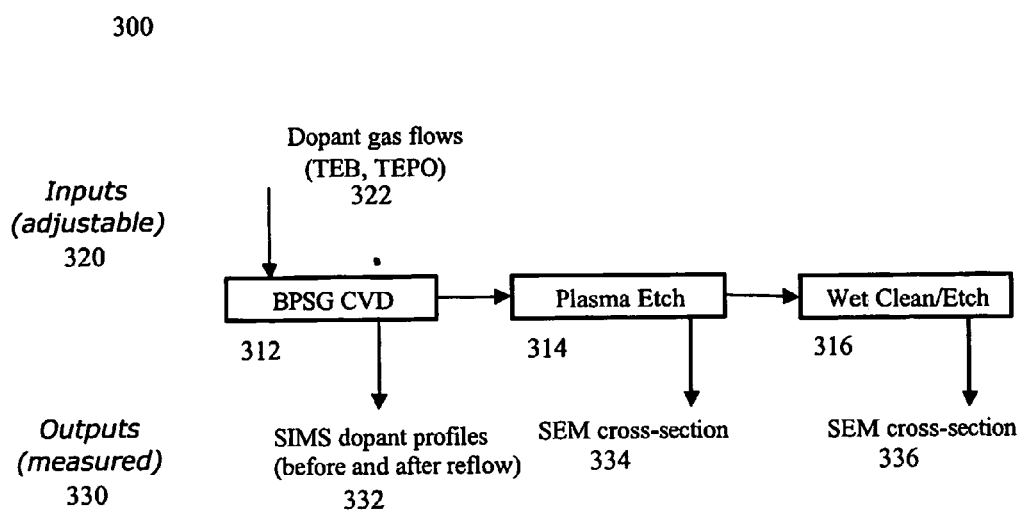
FIG. 5 illustrates an exemplary method of a cell formation process used for modeling purposes according to one embodiment of the present invention.

FIG. 5 illustrates an exemplary method of a cell formation process used for modeling purposes, according to one embodiment of the present invention. One embodiment of this invention simplifies the optimization problem described above by reducing the number of inputs and outputs for the cell formation process as shown in FIG. 5. Comparing FIG. 5 to FIG. 1, one sees that in the simplified process 300 of FIG. 5 the number of inputs 320 has been reduced to only two, namely the dopant gas flows 322 of TEB and TEPO. One also sees that the outputs 330 have been reduced to only dopant profiles 332 and SEM cross-section sidewall profiles 334 and 336.

One embodiment of the present invention further creates a dynamic system model for this process that has only two (2) inputs, namely TEB and TEPO flows 322, and only two (2) outputs, namely deviation of the actual sidewall profile from vertical along the two horizontal axes, namely the X-axis 610 and the Y-axis 620. Both of these outputs are measured from the SEM cross-section sidewall profiles after wet clean/etch, namely from the outputs 336. All other inputs and parameter settings are kept constant at values that are typical for this process. The reasoning behind this approach is that the TEB and TEPO flows 322 are the main variables that determine the Boron (B) and Phosphorus (P) dopant concentrations of the film deposited on the substrate, which in turn are the main variables that determine the etch speed and thus the shape of the cell sidewall. Therefore, using the TEB and TEPO flows 322 as the only input variables and keeping everything else constant provides enough flexibility in optimizing the sidewall profile while reducing the complexity of the modeling process to a much more manageable level.

The identification of the parameters for this two-input-two-output dynamic system model can be performed using any identification method for linear dynamic systems, such as ARX (Auto-Regressive with eXogenous inputs) or ARMAX (Auto-Regressive Moving Average with eXogenous inputs) methods. Alternatively, the modeling accuracy can be improved by incorporating input nonlinearities in the linear dynamic model and using the INARX (Input-Nonlinear ARX) methods described below. In general, use of any of these methods results in a nonlinear dynamic model consisting of multiple linear or input-nonlinear models that accurately describe the behavior of the process around different operating points. This parameter identification uses as input data the selected values of TEB and TEPO flows 322 with respect to time, and as output data the deviation of the resulting X-axis 610 and Y-axis 620 sidewall profiles from a vertical reference position.

The output data is obtained from the SEM cross-section photographs of the sidewall profiles after wet clean/etch 336. Since these photographs are originally recorded in digital format from the SEM tool, they can be processed by image processing algorithms that perform edge detection. Once the edges in the photographs are detected, their pixel position is known, and their deviation from vertical is computed via a subtraction of pixel row numbers. The deviation is then stored as a function of etch depth, where etch depth is the corresponding pixel column number.

This process for determining sidewall deviation creates a spatial dynamic model for etch processes that uses etch depth, rather than time, as the independent variable. However, the gas flow recipes are functions of time, not depth. Therefore, one embodiment of the present invention incorporates a time-to-depth conversion component. One instantiation of such a component is a deposition rate model, which provides the rate, in Angstroms per second, at which the substrate is deposited as a function of the TEB and TEPO composition. In one embodiment of the present invention, this deposition rate model is created through separate experiments. In another embodiment of the present invention, this deposition rate model is created from the same experiments used to identify the parameters of the spatial dynamic model. Thus, the resulting dynamic model relates time-domain inputs to spatial-domain outputs, and implicitly incorporates the corresponding time-to-depth conversion.

By utilizing such a spatial dynamic model, one can employ constrained optimization methods to select values for the two inputs (TEB and TEPO time profiles 322) within the allowable input ranges that will minimize the values of the two outputs (deviation of X-axis 610 and Y-axis 620 sidewall profiles from vertical). In this context, the deposition rate model is used to predict the output values that will result from a given combination of input values, and then the optimization algorithm adjusts the input values until the output values are minimized. In fact, one can select any output criterion as the optimization goal. For example, if the desired profile is not vertical, but has a different shape, then the output of the process can be defined as the deviation from that shape, and the same optimization process can be used, subject to the allowable input ranges. Depending on the capabilities of the CVD tool used in this process, the maximum number of allowed value changes in the TEB and TEPO profiles may be limited to the maximum number of dopant layers that the CVD tool can deposit. In that case, the optimization can be modified to yield the smallest possible sidewall deviation among all input profiles that adhere to this limit of maximum value changes.

While the above methods are illustrated using only TEB and TEPO gas flows as inputs, one of ordinary skill in the art will immediately recognize that in alternate embodiments the same methodology can be applied to use any combination of TEB, TEPO, and TEOS gas flows as inputs. For example, one can use all three gas flows as inputs to create a three-input-two-output dynamic model of the CVD process, or only one of the gas flows to create a single-input-two-output dynamic model of the CVD process. The methods above and the equations described below would be modified for selection of one, two, or three inputs.

Furthermore, while the above methods are illustrated on the example of BPSG CVD processes, one of ordinary skill in the art will immediately recognize that any process that includes gas flows as inputs and sidewall profiles as outputs can be modeled in alternate embodiments, and its recipe can be optimized, using the methods described herein.

Model Identification and Validation Methods

The overall methodology of creating a dynamic model for an etch process that includes gas flows as inputs and sidewall profiles as outputs has been described above, according to one embodiments. Optimizing the recipe for that process using the resulting dynamic model to predict the result of any selected recipe is also described above. A typical structure for such a dynamic model is a linear ARX (Auto-Regressive with exogenous inputs) model expressed in Equation (1) below.

$$y(k)+A_1 y(k-1)+ \ldots +A_N y(k-N)=B_0 u(k)+ \ldots + B_N u(k-N)+e(k) \quad (1)$$

The sequences u(k), y(k), and e(k) in Equation (1) may be vector-valued as needed to represent multiple inputs and/or outputs, and the quantities $A_i$ and $B_i$ are matrices of compatible dimensions.

The linear structure of the ARX model in Equation (1) cannot faithfully capture the dynamic behavior of CVD processes, since such processes typically exhibit severe nonlinearities. These nonlinearities are inherent in the chemical interaction between the dopants in the substrate and the etch agents that occur during the etch process. One method of capturing these nonlinearities is to use several linear models of the type shown in Equation (1), with each model capturing the dynamic behavior of the process around a different operating point. In the case of etch processes, such an operating point would be defined by the recipe being used, and the corresponding linear model would accurately predict the output of the etch process for small recipe variations around the recipe used to define the operating point.

A better way of capturing the nonlinear behavior of etch processes is to consider model structures that explicitly incorporate nonlinearities. A model structure that was found to be particularly suitable for cell formation processes of the type illustrated in FIG. 1 is the INARX (Input-Nonlinear Auto-Regressive with eXogenous inputs) model defined in the expression below.

$$y(k)+A_1 y(k-1)+ \ldots +A_N y(k-N)=B_0 f_0(u(k))+ \ldots + B_N f_N(u(k-N))+e(k) \quad (2)$$

Compared to the linear ARX model of Equation (1), the INARX model of Equation (2) incorporates the functions $f_i(\cdot)$, which are smooth memoryless nonlinear functions (memoryless nonlinearities). When applied to a vector, these nonlinearities are applied to each individual element in the vector.

In order to make the identification problem easier to formulate, we consider memoryless nonlinearities that are linear combinations of a set of L basis nonlinearities $g_i(\cdot)$ as follows:

$$f_i(u(k)) = C_i \begin{bmatrix} g_1(u(k)) \\ \vdots \\ g_L(u(k)) \end{bmatrix} \quad (3)$$

The nonlinearity parametrization in Expression (3) may be combined with the general INARX model in Expression (2) to yield an equivalent linear ARX model:

$$y(k) + A_1 y(k-1) + \ldots + A_N y(k-N) = \quad (4a)$$
$$B_0 C_0 \begin{bmatrix} g_1(u(k)) \\ \vdots \\ g_L(u(k)) \end{bmatrix} + \ldots + B_N C_N \begin{bmatrix} g_1(u(k-N)) \\ \vdots \\ g_L(u(k-N)) \end{bmatrix} + e(k)$$

or $$y(k) + A_1 y(k-1) + \ldots + A_N y(k-N) = \quad (4b)$$
$$D_0 v(k) + \ldots + D_N v(k-N) + e(k)$$

where $$D_i = B_i C_i \text{ and } v(k) = \begin{bmatrix} g_1(u(k)) \\ \vdots \\ g_L(u(k)) \end{bmatrix} \quad (4c)$$

Figure 6:
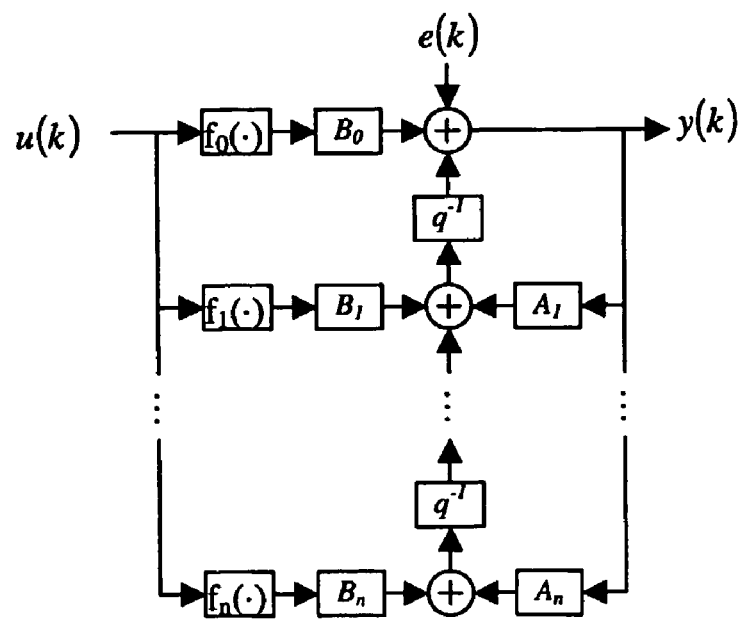
FIG. 6 illustrates an exemplary INARX (Input-Nonlinear Auto-Regressive with eXogenous inputs) model realization according to one embodiment of the present invention.

FIG. 6 illustrates an exemplary INARX model realization. The linear parametrization of Equations (4a)–(4c) permits the application of linear least squares identification techniques to fit an INARX model to one or more recorded input-output data sets. In other words, the linear reparametrization shown in Equations (4a)–(4c) allows us to treat the INARX model of Equation (4b) in the same way as the linear ARX model of Equation (1).

In particular, consider a data set obtained by measuring the inputs and outputs during and/or after an experiment:

$$\{v(1), \ldots, v(M), y(1), \ldots, y(M)\} \quad (5)$$

To identify the INARX model in the form of Equation (4b) from the data set (5), the equations are placed into a matrix form:

$$\begin{bmatrix} y_1^T(N+1) \\ \vdots \\ y_1^T(M) \end{bmatrix} = \begin{bmatrix} -y_1^T(N) & \cdots & -y_1^T(1) & v_1^T(N+1) & \cdots & -v_1^T(1) \\ \vdots & \vdots & \vdots & \vdots & & \vdots \\ -y_1^T(M-1) & \cdots & -y_1^T(M-N) & v_1^T(M) & \cdots & v_1^T(M-N) \end{bmatrix} \begin{bmatrix} A_1^T \\ \vdots \\ A_N^T \\ D_0^T \\ \vdots \\ D_N^T \end{bmatrix} + \begin{bmatrix} e_1^T(N+1) \\ \vdots \\ e_1^T(M) \end{bmatrix} \quad (6a)$$

or $$Y_1^T = \Phi_1^T \Theta^T + E_1^T \quad (6b)$$

The matrices $Y_1$ and $\Phi_1$ are constructed, from the measured data. The goal is to compute a parameter matrix $\Theta$ that minimizes the size of the equation error $E_1$. This is done by solving the least-squares problem:

$$\min_{\theta} \| Y_1^T - \Phi_1^T \theta^T \|_2 \quad (7)$$

If we have data sets from P different experiments, a parameter matrix $\Theta$ can be computed that explains all of the data sets by "stacking" the matrices from each experiment and solving the following problem:

$$\min_{\Theta} \left\| \begin{bmatrix} Y_1^T \\ \vdots \\ Y_P^T \end{bmatrix} - \begin{bmatrix} \Phi_1^T \\ \vdots \\ \Phi_P^T \end{bmatrix} \Theta^T \right\|_2 \quad (8)$$

Suppose now that each time an experiment is performed, an unknown but constant bias corrupts our output measurement. In that case, the data set is represented as follows:

$$\{v(1), \ldots, v(M), y(1)+z, \ldots, y(M)+z\} \quad (9)$$

Here, z represents the unknown but constant bias in the output measurement. If the biased output measurement is substituted into Equation (4b), the following expression is obtained:

$$y(k) + A_1 y(k-1) + \ldots + A_N y(k-N) + z + A_1 z + \ldots + A_N z = \quad (10)$$
$$D_0 v(k) + \ldots + D_N v(k-N) + e(k)$$

An equation bias d is defined as follows:

$$d = -z - A_1 z - \ldots - A_N z \quad (11)$$

Substituting Equation (11) into Equation (10) yields the following equation:

$$y(k) + A_1 y(k-1) + \ldots + A_N y(k-N) = D_0 v(k) + \ldots + D_N v(k-N) + e(k) + d \quad (12)$$

Equation bias d can be identified by adding it to the list of parameters to be identified and modifying the definitions of $\Phi$ and $\Theta$ appropriately. If a set of model parameters $\Theta$ using multiple data sets is to be identified, the fact that the bias may be different from experiment to experiment must be taken into account. This can be done by modifying the multiple-experiment optimization problem posed in Expression (8) as follows:

$$\min_{\Theta, d_i} \left\| \begin{bmatrix} Y_1^T \\ \vdots \\ Y_P^T \end{bmatrix} - \begin{bmatrix} \Phi_1^T & \Omega_1^T & \cdots & 0 \\ \vdots & \vdots & & \vdots \\ \Phi_P^T & 0 & \cdots & \Omega_P^T \end{bmatrix} \begin{bmatrix} \Theta^T \\ d_1^T \\ \vdots \\ d_P^T \end{bmatrix} \right\|_2 \quad (13a)$$

where $$\Omega_i = [1 \cdots 1] \quad (13b)$$

Solving the problem in Expressions (13a)–(13b) allows identification of the model parameters in a fashion that is robust to measurement biases that vary from experiment to experiment.

Once the model is identified, its quality can be evaluated by measuring how well its predictions agree with a new data set of measured inputs and outputs $\{v_t(1), \ldots, v_t(M), y_t(1), \ldots, y_t(M)\}$. If the model predictions are in good agreement with the new data set, then the model is said to have been "validated" on the new data.

The INARX model of Equation (4b) can be used directly to compute predicted outputs as follows:

1. Set the predicted output $\hat{y}_t(k)$ equal to the measured output $y_t(k)$ for $k=1, \ldots, N$.
2. For $k=N+1, \ldots, M$, compute the predicted output $\hat{y}_t(k)$ via the equation $$\hat{y}_t(k) = -A_1 \hat{y}_t(k-1) - \ldots - A_N \hat{y}_t(k-N) + D_0 v_t(k) + \ldots + D_N v_t(k-N) \quad (14)$$

3. Compare the predicted outputs $\hat{y}_t(k)$ to the measured outputs $y_t(k)$ for $k=N+1, \ldots, M$.

This method is an open-loop validation method, since it does not use an estimator to keep the predicted output "synchronized" to the measured output.

Consider now the model validation problem when unknown output error biases may be present. Assume that a set of model parameters $\Theta$ and a set of biases $d_1, \ldots, d_P$ have been computed using the measured input and output data from a set of P experiments and solving the optimization problem of Expression (13a)–(13b). Given a new set of measured inputs and outputs $\{v_t(1), \ldots, v_t(M), y_t(1), \ldots, y_t(M)\}$, the following method can be used for validating the model while accounting for measurement biases:

1. Using the new data, solve the following minimization problem to compute the unknown bias $d_t$:

$$\min_{d_i} \left\| Y_i^T - [\Phi_i^T \; \Omega_i^T] \begin{bmatrix} \Theta^T \\ d_i^T \end{bmatrix} \right\|_2 \quad (15)$$

2. Set the predicted output $\hat{y}_t(k)$ equal to the measured output $y_t(k)$ for $k=1, \ldots, N$.
3. For $k=N+1, \ldots, M$, compute the predicted output $\hat{y}_t(k)$ via the equation $$\hat{y}_t(k) = -A_1 \hat{y}_t(k-1) - \ldots - A_N \hat{y}_t(k-N) + D_0 v_t(k) + \ldots + D_N v_t(k-N) + d_i \quad (16)$$

4. Compare the predicted outputs $\hat{y}_t(k)$ to the measured outputs $y_t(k)$ for $k=N+1, \ldots, M$.

Figure 7:
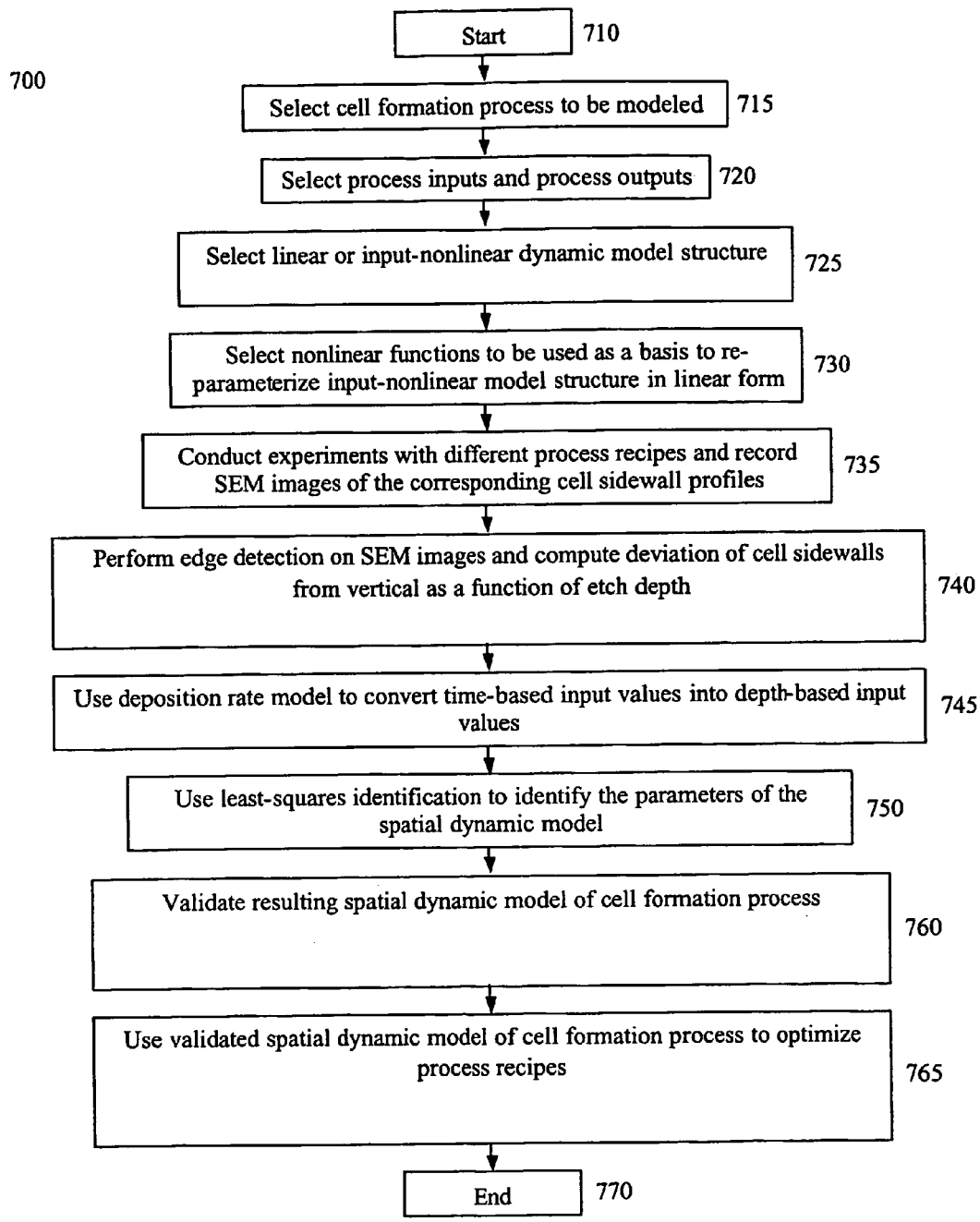
FIG. 7 illustrates an exemplary flowchart of a process modeling and recipe optimization method for a cell formation process, according to one embodiment of the present invention.

FIG. 7 illustrates an exemplary flowchart of a process modeling and recipe optimization method 700 for a cell formation process, according to one embodiment of the present invention. The process commences at block 710. At processing block 715, a user selects a cell formation process to be modeled, such as BPSG or different chemistry. As discussed above, a user can select process inputs and process outputs at processing block 720. At processing block 725, a user is prompted to select a linear or input-nonlinear dynamic model structure. A recommendation can be provided to the user depending on how nonlinear the specific process behavior is.

At processing block 730, a user is prompted to select nonlinear functions to be used as a basis to re-parameterize the input-nonlinear model structure in linear form as described above. Various tests and experiments with different process recipes are performed at processing block 735. SEM images of the corresponding cell sidewall profiles are recorded as well. At processing block 740, edge detection is performed on the SEM images and a deviation of cell sidewalls from vertical as a function of etch depth is computed. Thereby, the spatial images are converted into numerical outputs that can be used for parameter identification in a spatial dynamic model.

The process continues at block 745 where a deposition rate model is used to convert time-based input values into depth-based input values that can be used for parameter identification in a spatial dynamic model. At processing block 750, least-squares identification is used to identify the parameters of the spatial dynamic model, including output measurement biases. The resulting spatial dynamic model of the cell formation process is validated at processing block 760 by conducting additional experiments and comparing the output values predicted by the model to the actual output values for the new experiments.

At processing block 765 the validated spatial dynamic model of cell formation process is used to optimize process recipes by adjusting input values until the output values predicted by the model match the desired output values as closely as possible under the maximum and minimum value constraints imposed on the process inputs. The process completes at block 770.

Figure 8:
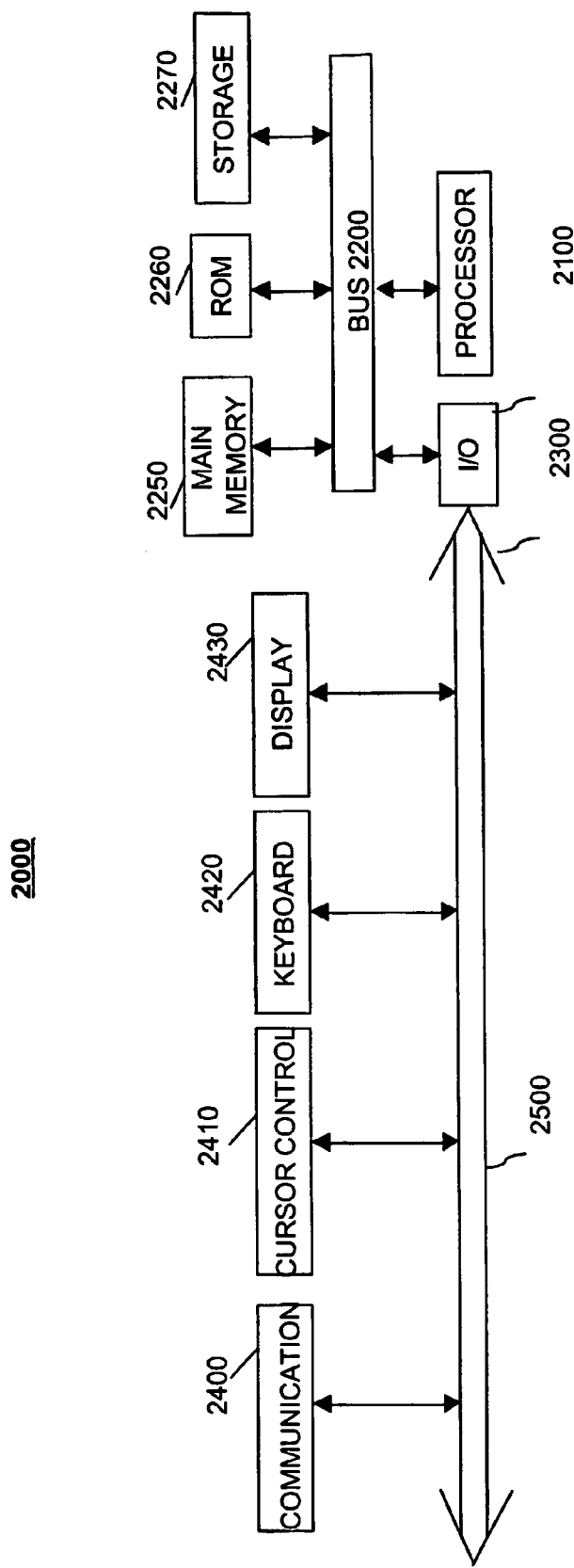
FIG. 8 illustrates an exemplary block diagram of a computer system 2000 representing an integrated multi-processor, in which elements of the present invention may be implemented.

FIG. 8 illustrates an exemplary block diagram of a computer system 2000 representing an integrated multi-processor, in which elements of the present invention may be implemented. Computer system 2000 can be used to perform the method 700 described above in connection with FIG. 7. One embodiment of computer system 2000 comprises a system bus 2200 for communicating information, and a processor 2100 coupled to bus 2200 for processing information. Computer system 2000 further comprises a random access memory (RAM) or other dynamic storage device 2250 (referred to herein as main memory), coupled to bus 2200 for storing information and instructions to be executed by processor 2100. Main memory 2250 also may be used for storing temporary variables or other intermediate information during execution of instructions by processor 2100. Computer system 2000 also may include a read only memory (ROM) and/or other static storage device 2260 coupled to bus 2200 for storing static information and instructions used by processor 2100.

A data storage device 2270 such as a magnetic disk or optical disc and its corresponding drive may also be coupled to computer system 2000 for storing information and instructions. Computer system 2000 can also be coupled to a second I/O bus 2500 via an I/O interface 2300. A plurality of I/O devices may be coupled to I/O bus 2500, including a display device 2430, an input device (e.g., an alphanumeric input device 2420 and/or a cursor control device 2410). For example, video news clips and related information may be presented to the user on the display device 2430.

The communication device 2400 is for accessing other computers (servers or clients) via a network. The communication device 2400 may comprise a modem, a network interface card, or other well-known interface device, such as those used for coupling to Ethernet, token ring, or other types of networks.

In the foregoing specification, the invention has been described with reference to specific embodiments. It will, however, be evident that various modifications and changes can be made without departing from the broader spirit and scope of the invention as set forth in the claims. The specification and drawings are, accordingly, to be regarded in an illustrative rather than a restrictive sense.

What is claimed is:

1. A method, comprising:
   modeling an etch process used in semiconductor manufacturing to generate a dynamic process model;
   using the dynamic process model to determine input parameters that meet a desired output parameter; and
   optimizing a process recipe for the etch process with the input parameters.

2. The method of claim 1, wherein the etch process is a cell formation process.

3. The method of claim 1, wherein the dynamic process model is a linear ARX model with input nonlinearities.

4. The method of claim 1 wherein the optimized process recipe improves cell sidewall profiles.

5. The method of claim 4, wherein the optimized process recipe incorporates a maximum allowable number of recipe steps as an explicit process constraint.

6. The method of claim 4, wherein the optimized process recipe incorporates a maximum allowable input value as an explicit process constraint.

7. The method of claim 4, wherein the optimized process recipe incorporates a minimum allowable input value as an explicit process constraint.

8. The method of claim 1, wherein modeling an etch process, comprises:
   using a non-linear model structure;
   paramaterizing one or more memoryless non-linear functions associated with the non-linear model structure;
   deriving a linear model from the non-linear model structure;
   identifying a bias value for one or more input parameters and one or more output parameters;
   generating a dynamic spatial model of the one or more output parameters, wherein the one or more input parameters in a time domain relate to the one or more output parameters in a spatial domain;
   predicting one or more future output parameters when one or more test input parameters are provided to the linear model; and
   optimizing the one or more output parameters using the linear model.

9. The method of claim 8, wherein the dynamic spatial model is a deposition rate model.

10. The method of claim 8, wherein the one or more input parameters include:
    one or more dopant gas flows including TriEthyl Borate, TriEthyl PhOsphate, and TetraEthyl OrthoSilicate; and
    one or more plasma etch inputs including pressure, power, and gas flows.

11. The method of claim 8, wherein the one or more output parameters include one or more chemical vapor deposition outputs including Secondary Ion Mass Spectrometry dopant profiles before and after reflow, Fourier Transform Infrared Spectroscopy aggregate dopant profiles, plasma etch outputs, and wet clean outputs including electrical measurements, critical dimension measurements, Scanning Electron Microscopy cross-section sidewall profiles before and after wet etch in both X and Y directions.

12. The method of claim 8, wherein the non-linear model structure is an INARX model, wherein the memoryless non-linear functions capture dynamic etch process behaviors.

13. The method of claim 1, further comprising manufacturing a semiconductor wafer with cell profile deviations less than 100 angstroms.

14. A system, comprising:
    means for modeling an etch process used in semiconductor manufacturing to generate a dynamic process model;

means for using the dynamic process model to determine input parameters that meet a desired output parameter; and means for optimizing a process recipe for the etch process with the input parameters.

15. The system of claim 14, wherein the etch process is a cell formation process.

16. The system of claim 14, wherein the dynamic process model is a linear ARX model with input nonlinearities.

17. The system of claim 14, wherein the optimized process recipe improves cell sidewall profiles.

18. The system of claim 17, wherein the optimized process recipe incorporates a maximum allowable number of recipe steps as an explicit process constraint.

19. The system of claim 17, wherein the optimized process recipe incorporates a maximum allowable input value as an explicit process constraint.

20. The system of claim 17, wherein the optimized process recipe incorporates a minimum allowable input value as an explicit process constraint.

21. The system of claim 14, wherein modeling an etch process, comprises:
means for using a non-linear model structure;
means for paramaterizing one or more memoryless non-linear functions associated with the non-linear model structure;
means for deriving a linear model from the non-linear model structure;
means for identifying a bias value for one or more input parameters and one or more output parameters;
means for generating a dynamic spatial model of the one or more output parameters, wherein the one or more input parameters in a time domain relate to the one or more output parameters in a spatial domain;
means for predicting one or more future output parameters when one or more test input parameters are provided to the linear model; and
means for optimizing the one or more output parameters using the linear model.

22. The system of claim 21, wherein the dynamic spatial model is a deposition rate model.

23. The system of claim 21, wherein the one or more input parameters include:
one or more dopant gas flows including TriEthyl Borate, TriEthyl PhOsphate, and TetraEthyl OrthoSilicate; and
one or more plasma etch inputs including pressure, power, and gas flows.

24. The system of claim 21, wherein the one or more output parameters include one or more chemical vapor deposition outputs including Secondary Ion Mass Spectrometry dopant profiles before and after reflow, Fourier Transform Infrared Spectroscopy aggregate dopant profiles, plasma etch outputs, and wet clean outputs, wherein the wet clean outputs include electrical measurements, critical dimension measurements, and Scanning Electron Microscopy cross-section sidewall profiles before and after wet etch in both X and Y directions.

25. The system of claim 21, wherein the non-linear model structure is an INARX model, wherein the memoryless non-linear functions capture dynamic etch process behaviors.

26. The system of claim 14, further comprising means for manufacturing a semiconductor wafer with cell profile deviations less than 100 angstroms.

27. A computer readable medium, having stored thereon computer-readable instructions, which when executed in a computer system, cause the computer system to perform:
modeling an etch process used in semiconductor manufacturing to generate a dynamic process model;
using the dynamic process model to determine input parameters that meet a desired output parameter; and
optimizing a process recipe for the etch process with the input parameters.

28. The computer-readable medium of claim 27, wherein the etch process is a cell formation process.

29. The computer-readable medium of claim 27, wherein the dynamic process model is a linear ARX model with input nonlinearities.

30. The computer-readable medium of claim 27, wherein the optimized process recipe improves cell sidewall profiles.

31. The computer-readable medium of claim 30, wherein the optimized process recipe incorporates a maximum allowable number of recipe steps as an explicit process constraint.

32. The computer-readable medium of claim 30, wherein the optimized process recipe incorporates a maximum allowable input value as an explicit process constraint.

33. The computer-readable medium of claim 30, wherein the optimized process recipe incorporates a minimum allowable input value as an explicit process constraint.

34. The computer-readable medium of claim 27, further having stored thereon computer-readable instructions, which when executed in the computer system when modeling an etch process, cause the computer system to perform:
using a non-linear model structure;
paramaterizing one or more memoryless non-linear functions associated with the non-linear model structure;
deriving a linear model from the non-linear model structure;
identifying a bias value for one or more input parameters and one or more output parameters;
generating a dynamic spatial model of the one or more output parameters, wherein the one or more input parameters in a time domain relate to the one or more output parameters in a spatial domain;
predicting one or more future output parameters when one or more test input parameters are provided to the linear model; and
optimizing the one or more output parameters using the linear model.

35. The computer-readable medium of claim 34, wherein the dynamic spatial model is a deposition-rate model.

36. The computer-readable medium of claim 34, wherein the one or more input parameters include:
one or more dopant gas flows including TriEthyl Borate, TriEthyl PhOsphate, and TetraEthyl OrthoSilicate; and
one or more plasma etch inputs including pressure, power, and gas flows.

37. The computer-readable medium of claim 34, wherein the one or more output parameters include one or more chemical vapor deposition outputs including Secondary Ion Mass Spectrometry dopant profiles before and after reflow, Fourier Transform Infrared Spectroscopy aggregate dopant profiles, plasma etch outputs, and wet clean outputs including electrical measurements, critical dimension measurements, Scanning Electron Microscopy cross-section sidewall profiles before and after wet etch in both X and Y directions.

38. The computer-readable medium of claim 34, wherein the non-linear model structure is an INARX model, wherein the memoryless non-linear functions capture dynamic etch process behaviors.

39. The computer-readable medium of claim 27, further having stored thereon computer-readable instructions, which when executed in the computer system, cause the computer system to perform manufacturing a semiconductor wafer with cell profile deviations less than 100 angstroms.

* * * * *